United States Patent
Fumagalli et al.

(10) Patent No.: US 10,892,224 B2
(45) Date of Patent: Jan. 12, 2021

(54) APPARATUSES COMPRISING PROTECTIVE MATERIAL ALONG SURFACES OF TUNGSTEN-CONTAINING STRUCTURES

(71) Applicant: Micron Technology, Inc., Boise, ID (US)

(72) Inventors: Luca Fumagalli, Boise, ID (US); Davide Colombo, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/904,683

(22) Filed: Feb. 26, 2018

(65) Prior Publication Data
US 2019/0267328 A1   Aug. 29, 2019

(51) Int. Cl.
| | |
|---|---|
| H01L 23/52 | (2006.01) |
| H01L 23/532 | (2006.01) |
| H01L 23/528 | (2006.01) |
| H01L 27/108 | (2006.01) |
| H01L 21/768 | (2006.01) |
| H01L 21/285 | (2006.01) |
| H01L 21/02 | (2006.01) |

(52) U.S. Cl.
CPC .... *H01L 23/53266* (2013.01); *H01L 21/0217* (2013.01); *H01L 21/02164* (2013.01); *H01L 21/28556* (2013.01); *H01L 21/76834* (2013.01); *H01L 21/76852* (2013.01); *H01L 21/76877* (2013.01); *H01L 21/76892* (2013.01); *H01L 23/528* (2013.01); *H01L 23/5329* (2013.01); *H01L 27/108* (2013.01); *H01L 27/10805* (2013.01); *H01L 27/10885* (2013.01)

(58) Field of Classification Search
None
See application file for complete search history.

(56) References Cited

U.S. PATENT DOCUMENTS

| | | | | |
|---|---|---|---|---|
| 6,239,014 | B1* | 5/2001 | Liaw | H01L 21/32051 257/E21.295 |
| 2002/0113237 | A1* | 8/2002 | Kitamura | H01L 23/485 257/71 |
| 2002/0146899 | A1* | 10/2002 | Chun | H01L 21/76831 438/618 |
| 2002/0173129 | A1* | 11/2002 | Shin | H01L 21/76843 438/586 |
| 2007/0004162 | A1* | 1/2007 | Tang | H01L 27/108 438/372 |

(Continued)

*Primary Examiner* — Bilkis Jahan
(74) *Attorney, Agent, or Firm* — Wells St. John P.S.

(57) ABSTRACT

Some embodiments include an apparatus having a structure with a surface which comprises tungsten. The apparatus has titanium-nitride-containing protective material along and directly against the surface. The structure may be a digit line of a memory array. Some embodiments include a method in which an assembly is formed to have a tungsten-containing layer with an exposed tungsten-containing upper surface. Titanium-nitride-containing protective material is formed over and directly against the tungsten-containing upper surface. Additional material is formed over the protective material, and is spaced from the tungsten-containing upper surface by the protective material. The additional material may comprise silicon nitride and/or silicon dioxide.

5 Claims, 10 Drawing Sheets

(56) References Cited

U.S. PATENT DOCUMENTS

| | | | | |
|---|---|---|---|---|
| 2012/0199944 A1* | 8/2012 | Huang | ............... | H01G 4/20 |
| | | | | 257/532 |
| 2014/0247654 A1* | 9/2014 | Rigano | ............... | H01L 27/2445 |
| | | | | 365/163 |
| 2015/0170730 A1* | 6/2015 | Antonyan | ............... | G11C 11/4099 |
| | | | | 365/189.07 |
| 2015/0214135 A1* | 7/2015 | Aya | ............... | H01L 21/32139 |
| | | | | 257/774 |
| 2016/0093672 A1* | 3/2016 | Li | ............... | G11C 13/0069 |
| | | | | 257/4 |
| 2018/0122478 A1* | 5/2018 | Morris | ............... | G11C 11/2273 |

* cited by examiner

US 10,892,224 B2

APPARATUSES COMPRISING PROTECTIVE MATERIAL ALONG SURFACES OF TUNGSTEN-CONTAINING STRUCTURES

TECHNICAL FIELD

Protective material along surfaces of tungsten-containing structures; and methods of forming apparatuses having tungsten-containing structures.

BACKGROUND

Memory is utilized in modern computing architectures for storing data. One type of memory is Dynamic Random Access Memory (DRAM). DRAM may provide advantages of structural simplicity, low cost and high speed in comparison to alternative types of memory.

DRAM may utilize memory cells each having one capacitor in combination with one transistor (so-called 1T-1C memory cells), with the capacitor being coupled with a source/drain region of the transistor. An example 1T-1C memory cell 1000 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art memory cell configuration utilizes two transistors in combination with one capacitor. Such configuration may be referred to as a 2T-1C memory cell. A 2T-1C memory cell 1010 is schematically illustrated in FIG. 2. The two transistors are labeled T1 and T2; and may be referred to as first and second transistors, respectively. The capacitor is labeled C. A source/drain region of the first transistor T1 connects with a first node of the capacitor C, and the other source/drain region of the first transistor T1 connects with a first comparative bitline (BL-T). A gate of the first transistor T1 connects with a wordline WL. A source/drain region of the second transistor T2 connects with a second node of the capacitor C, and the other source/drain region of the second transistor T2 connects with a second comparative bitline BL-C. A gate of the second transistor T2 connects with the wordline WL. The comparative bitlines BL-T and BL-C extend to a sense amplifier SA which compares electrical properties (e.g., voltage) of the two to ascertain a memory state of memory cell 1010. The bitline BL-T may be referred to as a true bitline, and the bitline BL-C may be referred to as a complementary bitline. The terms "true" and "complementary" are arbitrary, and merely indicate that the bitline values of BL-T and BL-C are to be compared to one another.

Another prior art memory cell configuration utilizes two capacitors in combination with two transistors. Such configuration may be referred to as a 2T-2C memory cell. A 2T-2C memory cell 1020 is schematically illustrated in FIG. 3. The two transistors of the memory cell are labeled T1 and T2, and may be referred to as first and second transistors, respectively. The two capacitors are labeled C1 and C2, and may be referred to as first and second capacitors, respectively. A source/drain region of the first transistor T1 connects with a node of the first capacitor C1, and the other source/drain region of the first transistor T1 connects with a first comparative bitline BL-T. A gate of the first transistor T1 connects with a wordline WL. A source/drain region of the second transistor T2 connects with a node of the second capacitor C2, and the other source/drain region of the second transistor T2 connects with a second comparative bitline BL-C. A gate of the second transistor T2 connects with the wordline WL. Each of the first and second capacitors C1 and C2 has a node electrically coupled with a common plate CP. The comparative bitlines BL-T and BL-C extend to a sense amplifier SA which compares electrical properties (e.g., voltage) of the two to ascertain a memory state of memory cell 1020.

Another prior art memory cell configuration utilizes three transistors in combination with one capacitor. Such configuration may be referred to as a 3T-1C memory cell. A 3T-1C memory cell 1030 is schematically illustrated in FIG. 4. The three transistors of the memory cell are labeled T1, T2 and T3; and may be referred to as first, second and third transistors, respectively. The capacitor is labeled C. A source/drain region of the first transistor T1 connects with a write bitline WBL, and the other source/drain region of the first transistor T1 connects with the capacitor C. A gate of the first transistor T1 connects with a write wordline WWL. A source/drain region of the second transistor T2 connects with a common plate CP, and the other source/drain region of the second transistor T2 connects with a source/drain region of the third transistor T3. A gate of the second transistor T2 connects with the capacitor C. One of the source/drain regions of the third transistor T3 is the source/drain region connected with the source/drain region of the second transistor T2, and the other connects with a read bitline RBL. A gate of the third transistor T3 connects with a read wordline RWL.

The memory cells of FIGS. 1-4 may be incorporated into memory arrays. An example DRAM array 1040 having 1T-1C memory cells is shown in FIG. 5. The DRAM array 1040 includes wordlines WL-1, WL-2, WL-3 and WL-4; and includes bitlines BL-1, BL-2, BL-3 and BL-4. Each of the memory cells is uniquely addressed through a combination of one of the wordlines and one of the bitlines.

A continuing goal of integrated circuit fabrication is to compress memory arrays into ever-increasing levels of integration. An associated goal is to fabricate digit lines to have ever-smaller cross-sectional dimensions while retaining suitable conductance. A conductive material showing utility for incorporation within digit lines is tungsten. However, tungsten may be problematically degraded by materials provided adjacent the digit lines. It would be desirable to develop new methods for utilizing tungsten in integrated circuitry (such as digit lines) which can alleviate or prevent problematic degradation of tungsten. It would also be desirable to develop new integrated circuit designs having structures configured to protect tungsten from problematic degradation.

DETAILED DESCRIPTION OF THE ILLUSTRATED EMBODIMENTS

Some embodiments include utilization of titanium-nitride-containing materials to protect tungsten-containing surfaces from degradation. Some embodiments include new integrated structures having titanium-nitride-containing liners along and directly against tungsten-containing surfaces. The tungsten-containing surfaces may be associated with digit lines. Example embodiments are described with reference to FIGS. 6-14.

Figure 6:
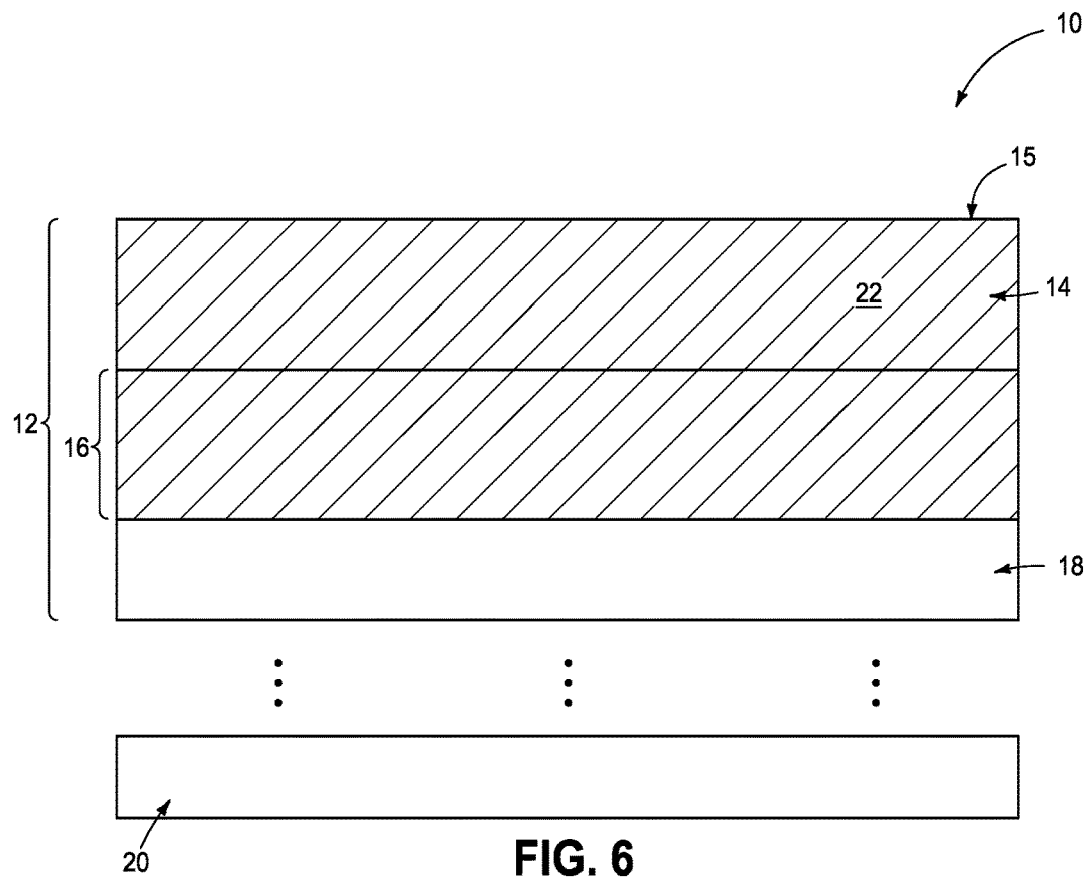
FIGS. 6-12 are diagrammatic cross-sectional views of a region of an apparatus at example process stages of an example method.

Referring to FIG. 6, an apparatus 10 includes an assembly 12 having a conductive tungsten-containing layer 14. In the illustrated example embodiment, the tungsten-containing layer 14 is over a conductive stack 16, which in turn is over a base 18. The assembly 12 is supported by a semiconductor substrate 20.

The tungsten-containing layer 14 comprises a tungsten-containing material 22. Such material may comprise, consist essentially of, or consist of tungsten.

The conductive stack 16 may comprise one or more conductive materials stacked one atop another. Such materials may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the tungsten-containing layer 14 and the stack 16 may be together configured as a bitline (i.e. digit line) stack suitable for being patterned into bitlines of a memory array.

The base 18 may comprise any suitable composition(s); and in some embodiments may comprise one or more of semiconductor material (e.g., silicon), insulative material (e.g., silicon dioxide), conductive material (e.g., metal), etc. For instance, in some embodiments the base 18 may comprise insulative material having conductive interconnects extending therethrough, as described in more detail below relative to FIG. 13.

The semiconductor substrate 20 may comprise any suitable semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

A gap is provided between the base 18 and the substrate 20 to indicate that additional materials and components may be provided between the base 18 and the substrate 20. In some embodiments, the base 18 may be directly against the substrate 20, and may be part of the substrate 20.

The tungsten-containing layer 14 has an exposed tungsten-containing surface 15. Such surface may comprise, consist essentially of, or consist of tungsten.

Figure 7:
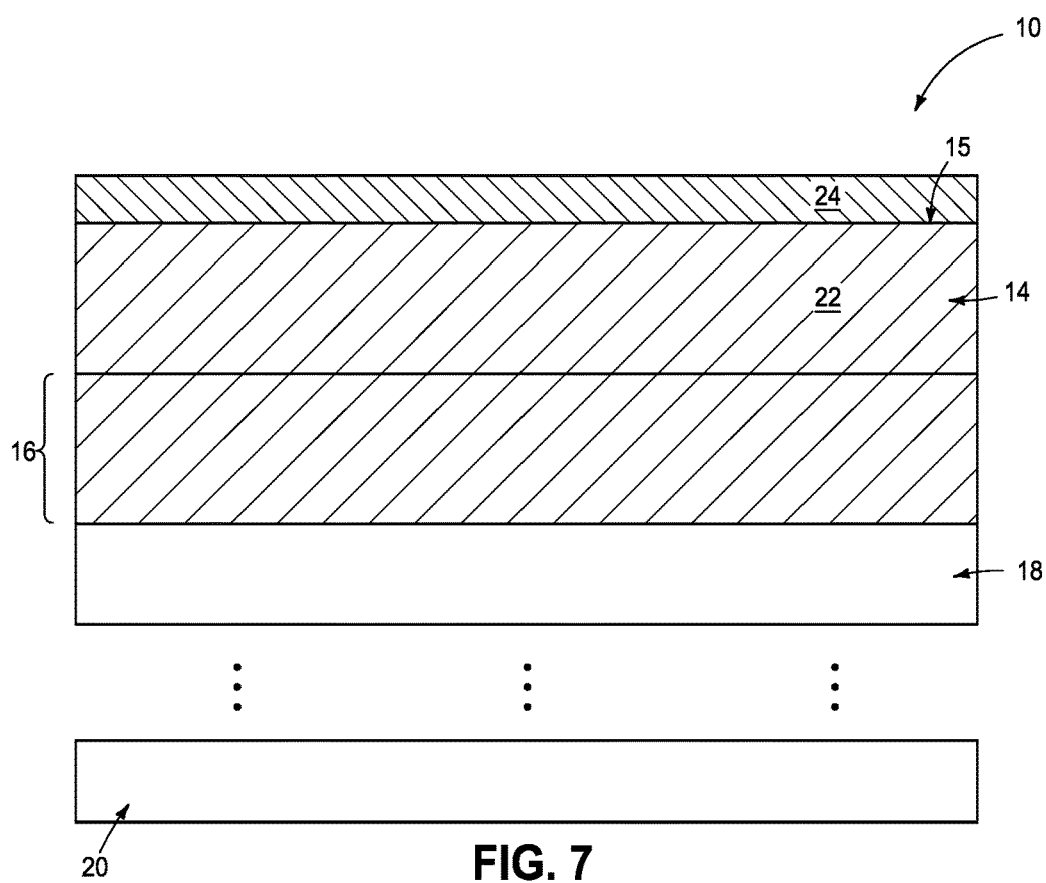

Referring to FIG. 7, protective material 24 is formed over and directly against the tungsten-containing surface 15. The protective material 24 may comprise, consist essentially of, or consist of titanium nitride. The surface 15 covered by the protective material 24 may be referred to as a protected surface.

The protective material 24 may be formed with any suitable processing. For instance, metal-organic chemical vapor deposition (Mo-CVD) may be utilized to form titanium nitride of protective material 24. The Mo-CVD may utilize any suitable precursors; and in some embodiments may utilize tetrakis(dimethylamido)titanium (TDMAT), $H_2$ and $N_2$. Mo-CVD processes may advantageously avoid undesired damage to the underlying tungsten-containing material 22. As another example, titanium nitride of protective material 24 may be formed by atomic layer deposition with ammonia and $TiCl_4$. If the ammonia pulses are short enough, the titanium nitride may be formed without significant damage to the underlying tungsten-containing material 22.

The protective material 24 may be formed to any suitable thickness; and in some embodiments may be formed to a thickness within a range of from about 10 angstroms (Å) to about 300 Å. For instance, in some example embodiments the protective material 24 may be formed to a thickness within a range of from about 10 Å to about 100 Å.

Figure 8:
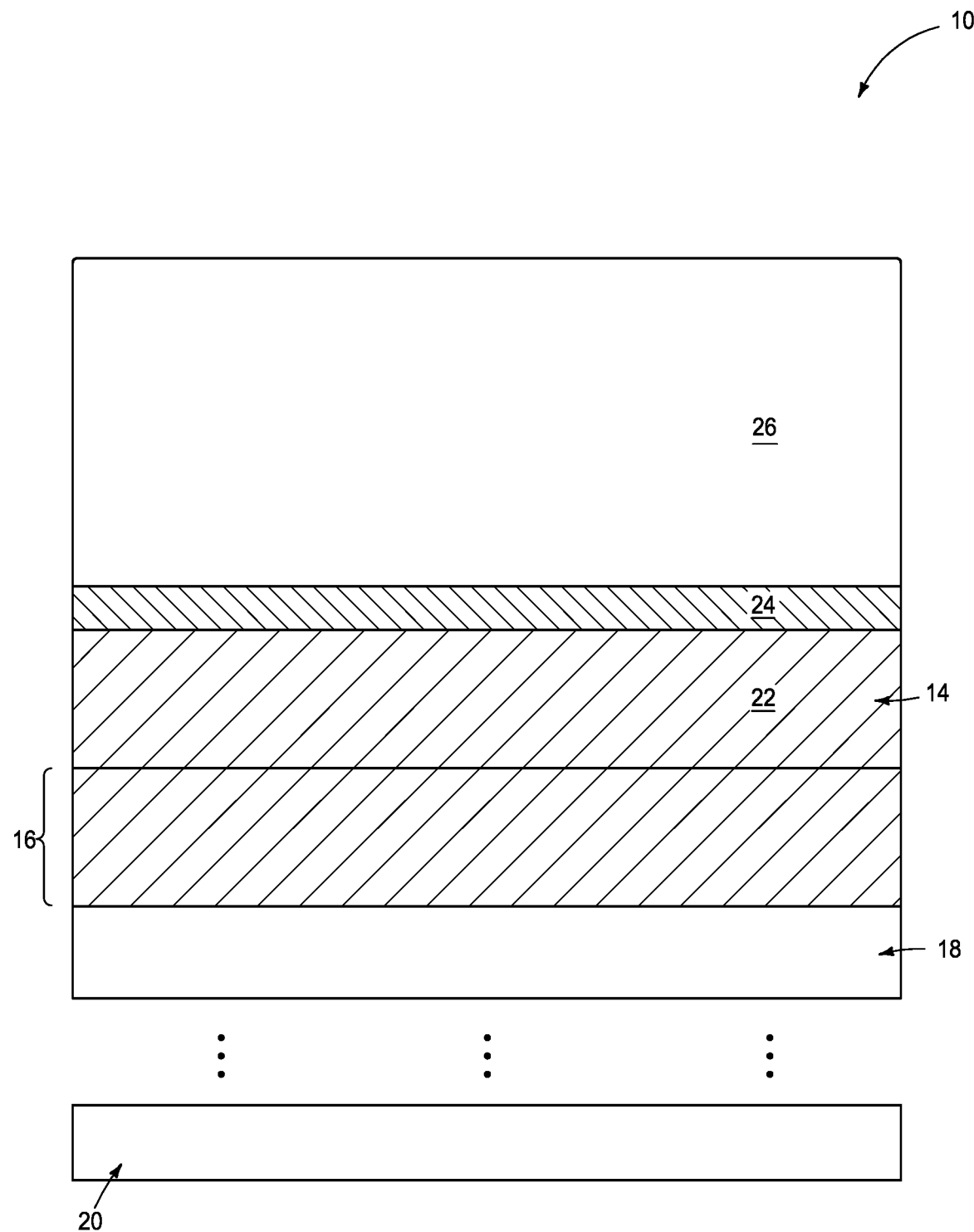

Referring to FIG. 8, additional material 26 is formed over the protective material 24. Such additional material may comprise, for example, one or both of silicon nitride and silicon dioxide, and may be referred to as an insulative capping material. In conventional methodology, the protective material 24 would be omitted, and instead the insulative capping material 26 would be formed directly against the tungsten-containing material 22. A problem with such methodology is that precursors utilized to form the insulative capping material 26 may react with tungsten of material 22 and thereby degrade electrical properties of the material 22. For instance, ammonia (or ammonium) may react with the tungsten of material 22 during formation of silicon nitride along a surface of the material 22. As another example, oxygen may react with the tungsten material 22 during formation of silicon dioxide along a surface of the material 22. The conventional methodology may be effective provided that the tungsten-containing material 22 is sufficiently thick that such material retains suitable conductive properties even after degradation of some of the material. However, the tungsten-containing material 22 is becoming increasingly thinner with higher levels of integration, and in many desired applications there is no longer enough of the tungsten-containing material to tolerate the degradation associated with conventional methodology. Accordingly, methodology provided herein forms the protective material 24 between the tungsten-containing material 22 and the problematic capping material 26.

Figure 9:
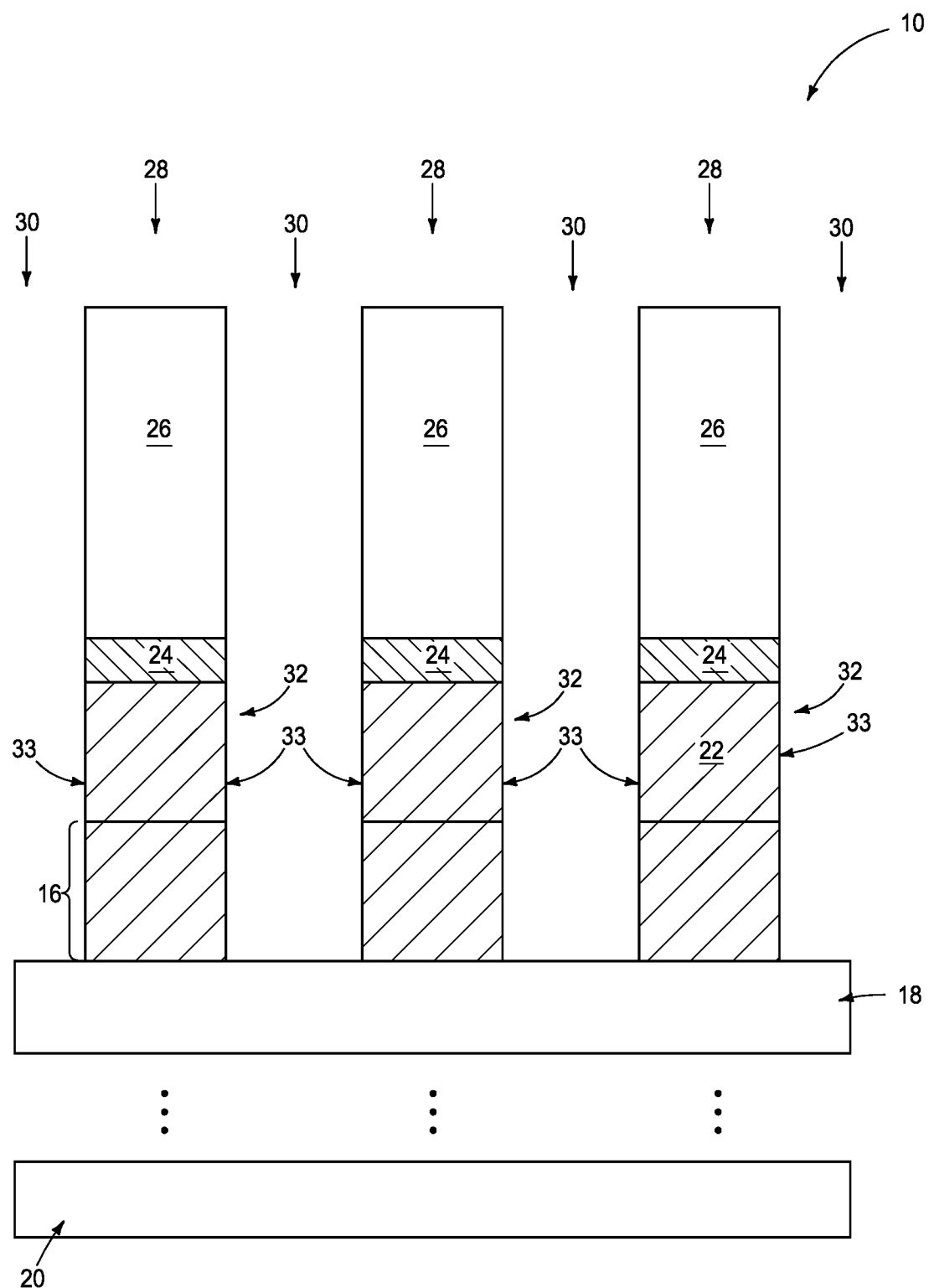

Referring to FIG. 9, the materials of stack 16, together with the materials 22, 24 and 26, are patterned into features 28. Such features are spaced apart from one another along the cross-section of FIG. 9, and in some embodiments may correspond to lines extending in and out of the page relative to the view of FIG. 9. Gaps 30 are between the spaced-apart features 28.

In some embodiments, the tungsten-containing material 22 of FIG. 9 may be considered to be configured as structures (e.g., lines) 32. Each of the lines 32 has exposed tungsten-containing sidewall surfaces 33. Such sidewall surfaces may comprise, consist essentially of, or consist of tungsten.

Figure 10:
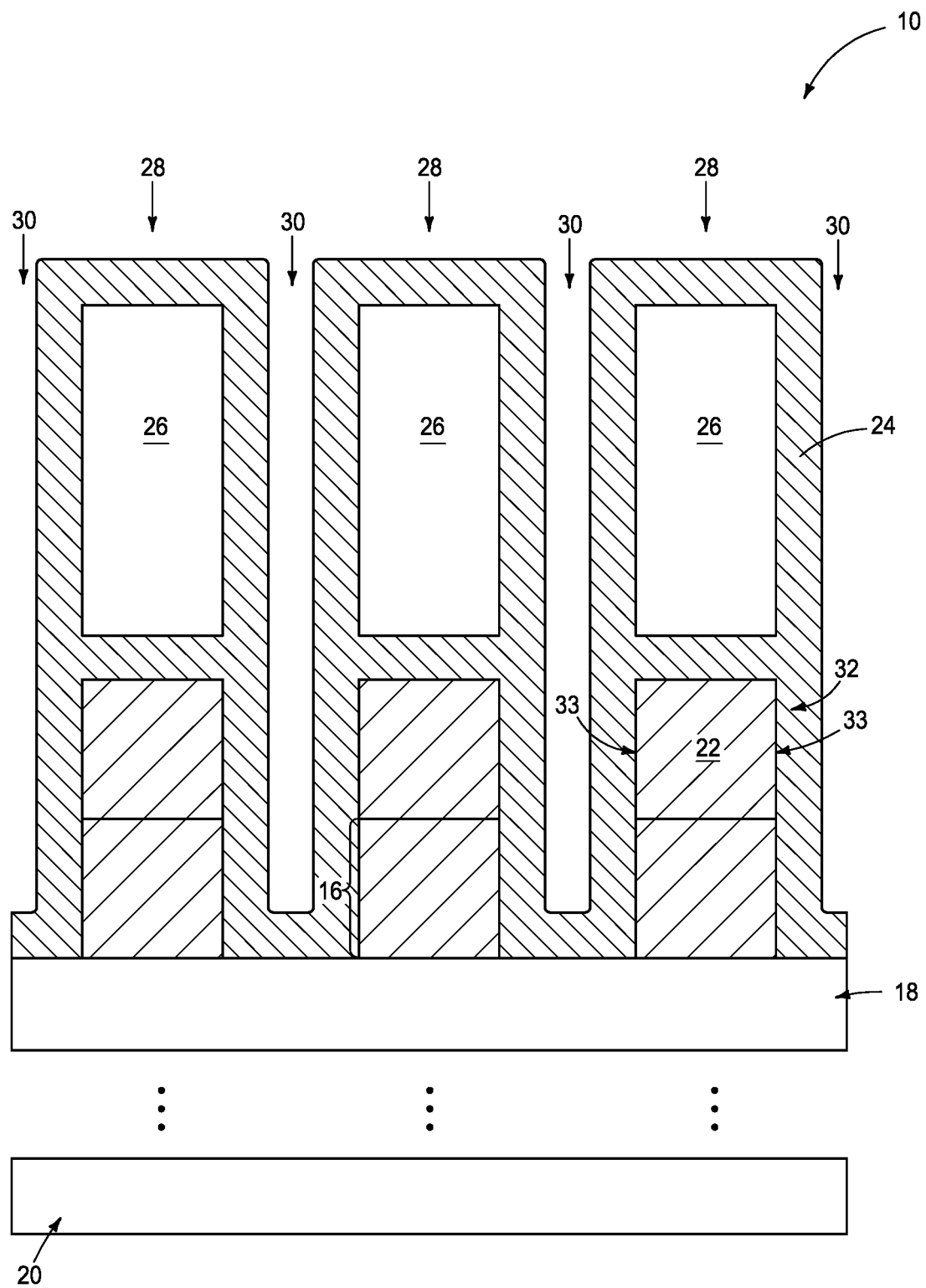

Referring to FIG. 10, the protective material 24 is formed to extend conformally along surfaces of the features 28, and across the gaps 30 between the features 28. The protective material 24 extends along and directly against the sidewall surfaces 33 of the tungsten-containing material 22. The protective material 24 deposited at the process stage of FIG. 10 may be formed utilizing any suitable processing; including, for example, the processing described above with reference to FIG. 7.

Figure 11:
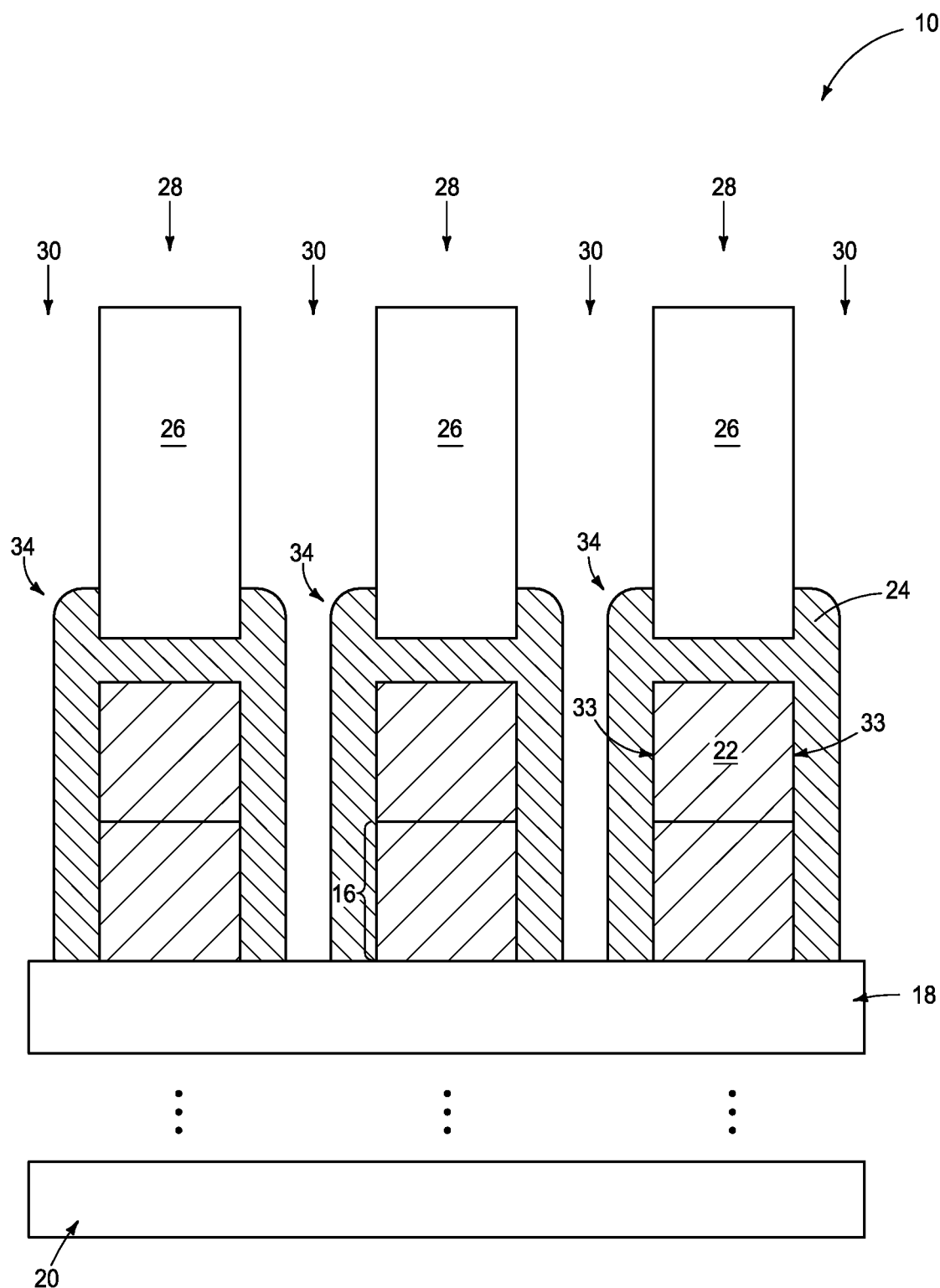

Referring to FIG. 11, the protective material 24 is anisotropically etched to remove some of the material from within the gaps 30, and to also remove the material from over the features 28. The processing stage of FIG. 11 may be considered to have the protective material 24 removed from gaps 30 between neighboring spaced-apart lines 32. Such may be advantageous in embodiments in which material 24 is electrically conductive (for instance, if material 24 comprises titanium nitride), as such may alleviate electrical shorting which would otherwise occur if material 24 remained within the gaps 30.

The conductive materials of stack 16, together with the conductive tungsten-containing material 22, and the conductive protective material 24, form a plurality of spaced-apart conductive structures 34. In some embodiments, such conductive structures may be digit lines extending into and out of the page relative to the view of FIG. 11. The removal of some of the material 24 from within the gaps 30 electrically isolates the spaced-apart conductive structures (e.g. digit lines) 34 from one another.

Figure 12:
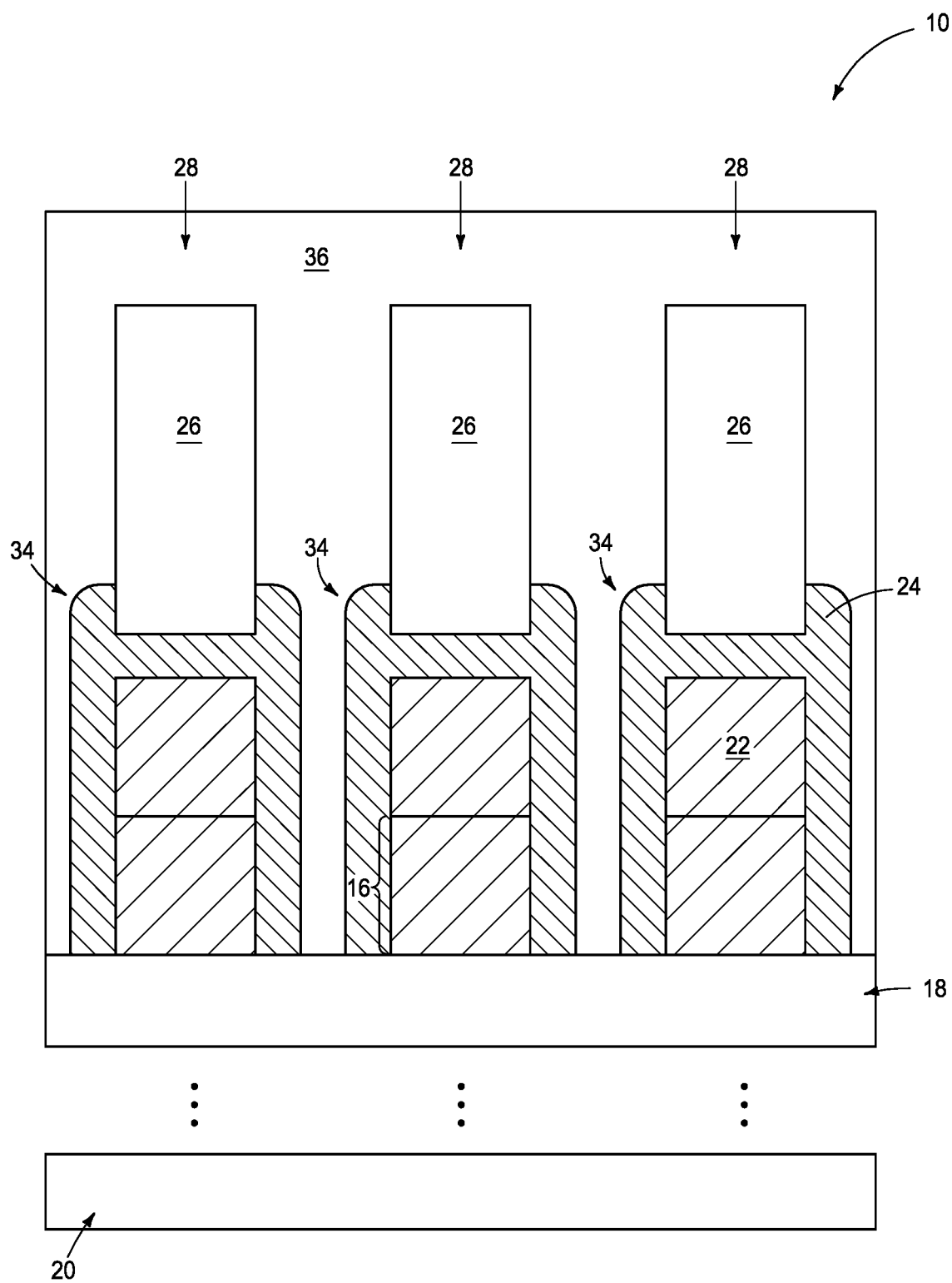

Referring to FIG. 12, insulative material 36 is formed over and between the features 28. The insulative material 36 may comprise a same composition as the capping material 26, or may comprise a different composition relative to the capping material 26. In some embodiments, the capping material 26 may comprise, consist essentially of, or consist of silicon nitride; and the insulative material 36 may comprise, consist essentially of, or consist of silicon dioxide.

Figure 13:
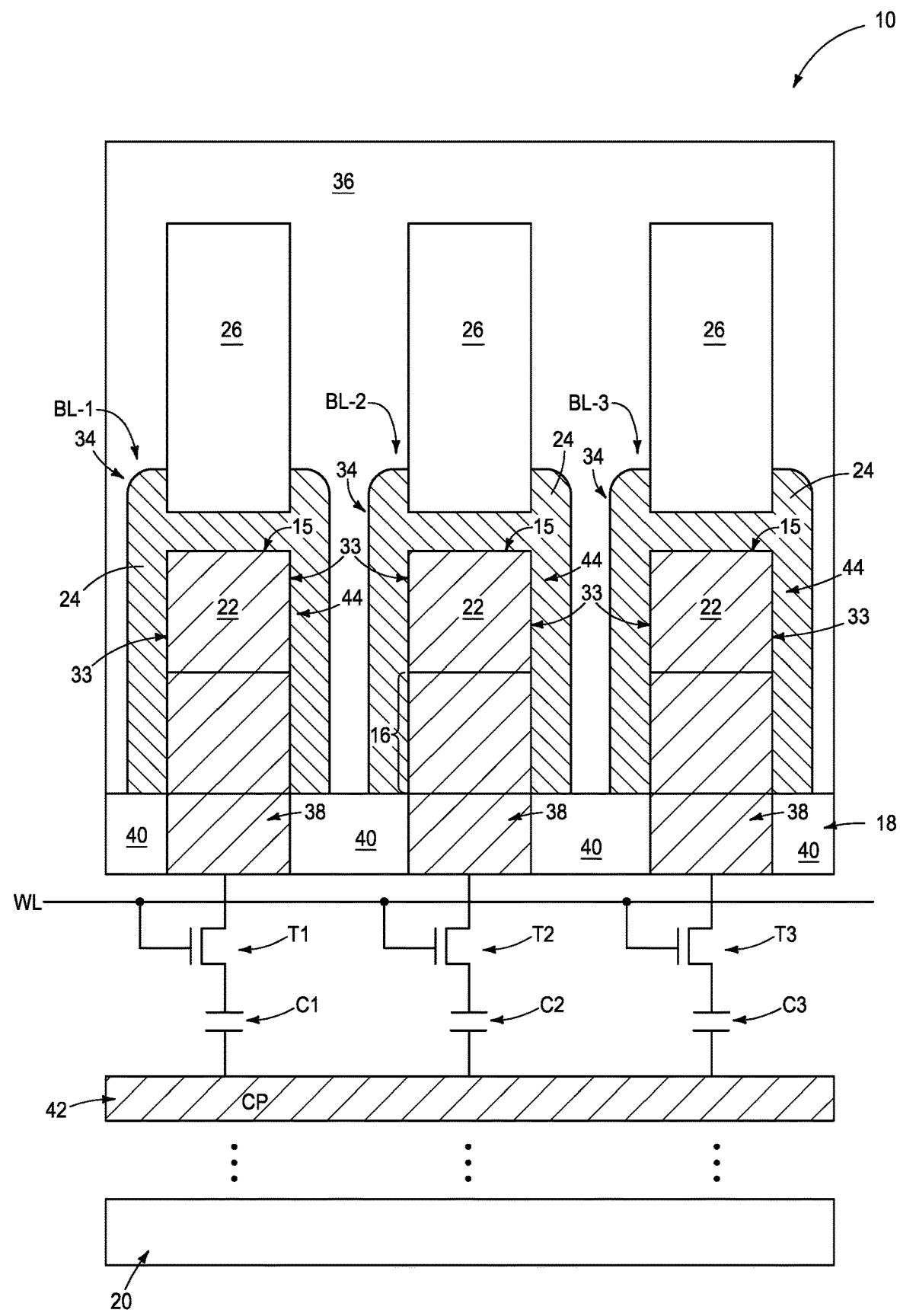
FIG. 13 is a diagrammatic cross-sectional view of the apparatus of FIG. 12 incorporated into a region of an example memory array.

Referring to FIG. 13, construction 10 is illustrated at a process stage analogous to that of FIG. 12, and in an application in which the conductive structures 34 correspond to digit lines (i.e. bitlines) incorporated into a memory array. The illustrated digit lines are labeled BL-1, BL-2 and BL-3.

Electrically conductive interconnects 38 extend through insulative material 40 of the base 18, and are coupled with source/drain regions of transistors. The transistors are labeled as T1, T2 and T3.

Each of the transistors has a gate coupled with a wordline WL.

Each of the transistors also has a source/drain region coupled with a capacitor. The capacitors are labeled as C1, C2 and C3.

The capacitors have nodes coupled with a common plate 42.

Figure 1:
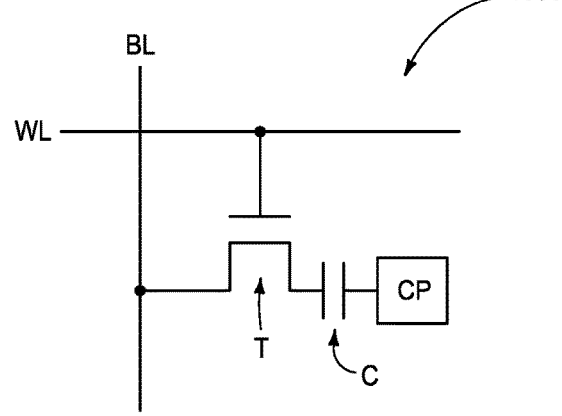
FIGS. 1-4 are schematic diagrams of example prior art memory cells.
Figure 3:
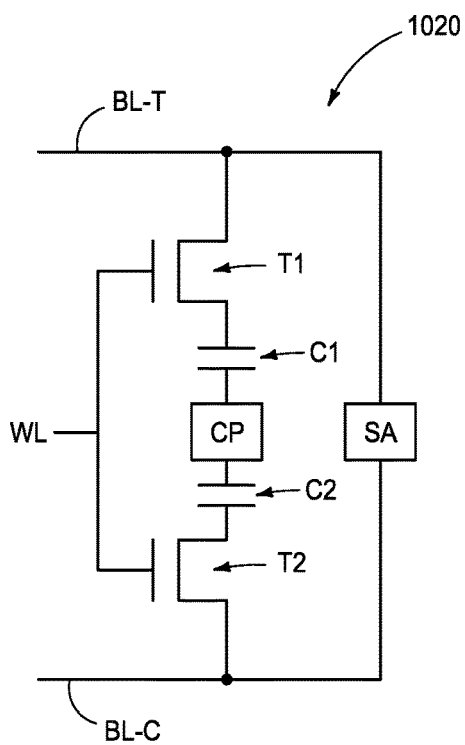
Figure 2:
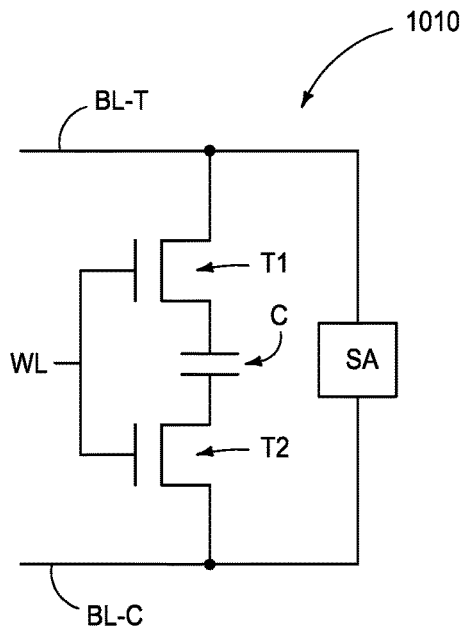
Figure 4:
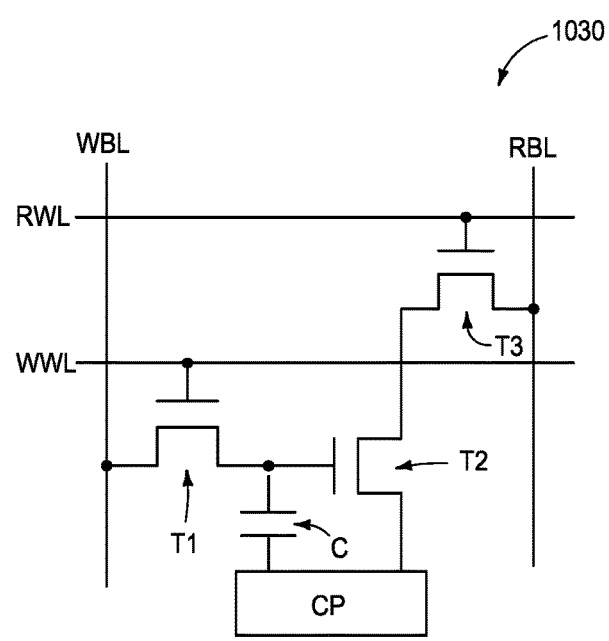
Figure 5:
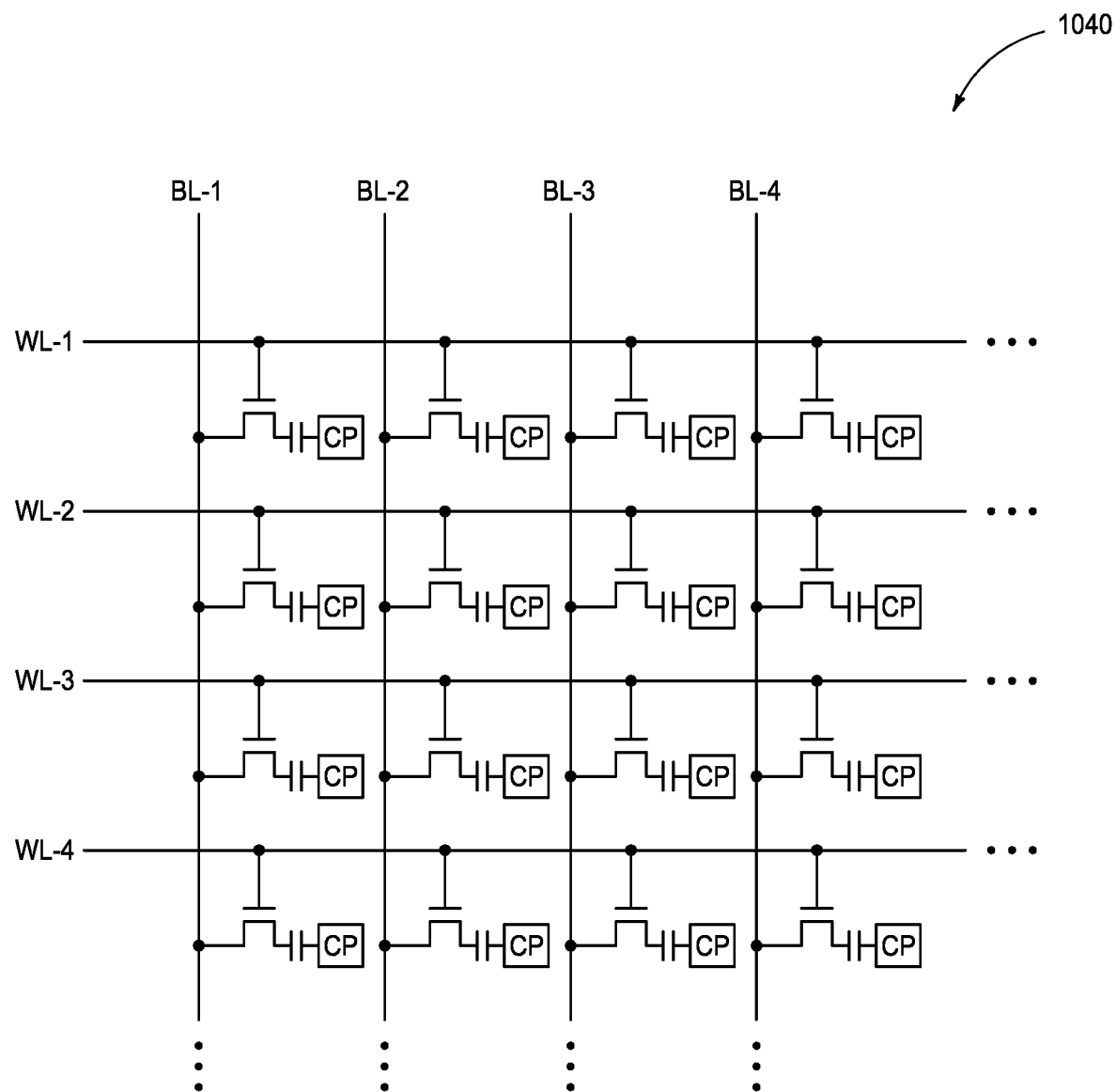
FIG. 5 is a schematic diagram of a region of an example prior art memory array.

In the illustrated embodiment, the memory array includes 1T-1C capacitors of the type described with reference to FIG. 1. In other embodiments, analogous memory arrays may be configured to comprise 2T-1C memory cells, 2T-2C memory cells, 3T-1C memory cells, etc.

In any of the memory arrays, the capacitors may utilize non-ferroelectric insulative material between the electrical nodes, or may utilize ferroelectric insulative material, or any other suitable insulative material. The insulative material within the capacitors (i.e., between the capacitor nodes) is sometimes called capacitor dielectric material. In some embodiments, the insulative material within the capacitors may comprise non-ferroelectric material and may, for example, consist of one or more of silicon dioxide, silicon nitride, aluminum oxide, hafnium oxide, zirconium oxide, etc. As another example, in some embodiments the insulative material within the capacitors may comprise ferroelectric material; and may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

In some embodiments, the tungsten-containing material 22 of FIG. 13 may be considered to be configured as conductive regions 44 within the conductive structures 34. Each of the conductive regions 44 has a top surface 15 and a pair of sidewall surfaces 33 extending downwardly from the top surface 15 (as shown relative to the cross-section of FIG. 13). The titanium nitride of protective material 24 is directly against the top surface 15 and the sidewall surfaces 33 of the tungsten-containing conductive regions 44. In some embodiments, the surfaces 15 and 33 of the tungsten-containing conductive regions 44 may comprise, consist essentially of, or consist of tungsten; and the protective material 24 may comprise, consist essentially of, or consist of titanium nitride.

Although the protective material 44 is shown to be directly against the sidewall surfaces 33 and the top surfaces 15 of the conductive regions 44, it is to be understood that in other embodiments the protective material may be against only the top surface 15, or only the sidewall surfaces 33. Further, it is to be understood that tungsten-containing structures may have other configurations besides the configurations of the regions 44 of FIG. 13, and in such configurations the tungsten-containing surfaces may have other configurations besides the illustrated top surfaces 15 and sidewall surfaces 33. Regardless, titanium-nitride-containing protective material may be formed to protect the tungsten-containing surfaces in accordance with aspects of the invention described herein. The tungsten-containing surfaces directly against the titanium nitride of the protective material may be considered to be protected surfaces, and in some embodiments may be protected from interaction with tungsten-degrading substances (e.g., ammonia, oxygen, etc.).

Figure 14:
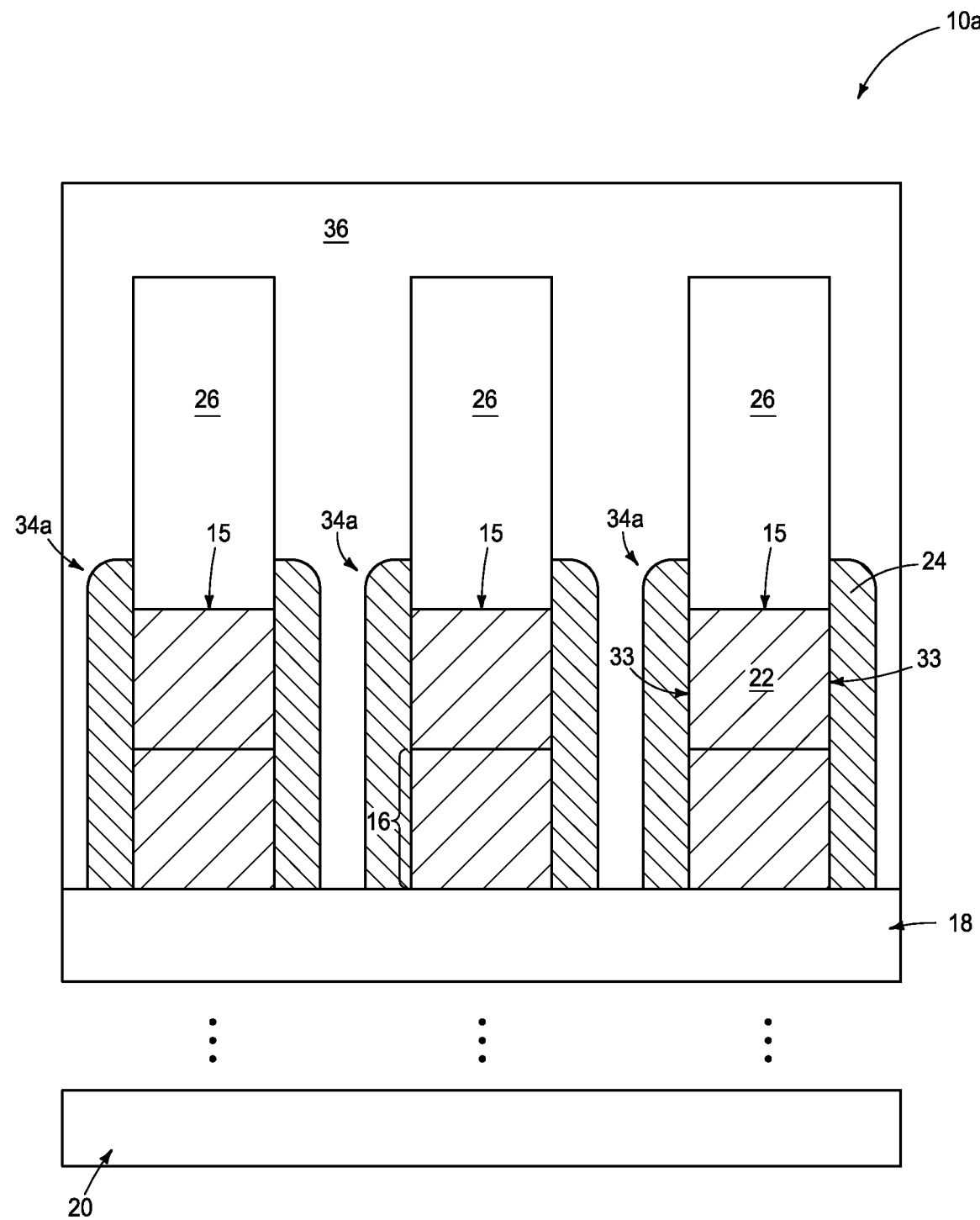
FIG. 14 is a diagrammatic cross-sectional view of a region of another example apparatus.

FIG. 14 shows a construction 10a having a configuration analogous to that of FIG. 12, but in accordance with an application in which the protective material 24 is provided only along the sidewalls 33 of the tungsten-containing material 22, rather than also being along the top surfaces 15 of the tungsten-containing material. The configuration of FIG. 14 may be suitable in applications in which the material 26 is formed under conditions which do not provide excessive degradation relative to the tungsten-containing material 22; but in which protection relative to the material 36, and/or the processing conditions utilized to form material 36, is still desired.

The configuration of FIG. 14 comprises conductive structures 34a analogous to the conductive structures 34 of FIG. 12. The conductive structures 34a may be configured as digit lines, and may be utilized in memory arrays. For instance, such digit lines may be utilized in memory arrays comprising 1T-1C memory cells, 2T-2C memory cells, 2T-1C memory cells, 3T-1C memory cells, etc.

The protective material described herein may be utilized for protecting surfaces of any tungsten-containing features utilized in integrated circuitry, including, for example, digit lines, wordlines, interconnects, wiring, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Some embodiments include an apparatus having a structure with a region which comprises tungsten. The region has a surface. A protective material is along said surface of the region. The protective material includes titanium nitride. The titanium nitride of the protective material is directly against the tungsten of said region. The surface directly against the titanium nitride of the protective material is a protected surface of the tungsten.

Some embodiments include an apparatus comprising a series of tungsten-containing lines extending across a supporting base. The tungsten-containing lines are spaced apart from one another. Each of the tungsten-containing lines comprises, along a cross-section, a top surface and a pair of sidewall surfaces extending downwardly from the top surface. Protective material is along the top surfaces and the sidewall surfaces of the tungsten-containing lines. The protective material comprises titanium nitride. The titanium nitride of the protective material is directly against the tungsten of the tungsten-containing lines.

Some embodiments include a method of forming an apparatus. An assembly is formed to have a tungsten-containing layer with an exposed tungsten-containing upper surface. Protective material is formed over and directly against the tungsten-containing upper surface. The protective material includes titanium nitride. Additional material is formed over the protective material, and is spaced from the tungsten-containing upper surface by the protective material.

Some embodiments include a method of forming an apparatus. An assembly is formed to have a tungsten-containing layer. The tungsten-containing layer is patterned into a plurality of spaced-apart lines. Each of the lines of said plurality has exposed tungsten-containing sidewall surfaces. Protective material is formed along and directly against the exposed tungsten-containing sidewall surfaces. The protective material comprises titanium nitride.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus comprising:
   a series of tungsten-containing lines extending across a supporting base; the tungsten-containing lines being spaced apart from one another;
   each of the tungsten-containing lines comprising, along a cross-section, a bottom surface facing the supporting base and being in direct physical contact with a conductive structure, an opposing top surface consisting essentially of tungsten, and a pair of sidewall surfaces consisting essentially of tungsten extending downwardly from the top surface, the conductive structure and the tungsten-containing line being of an identical width; and
   protective material along the top surfaces and the sidewall surfaces of the tungsten-containing lines; the protective material comprising titanium nitride; the titanium nitride of the protective material having a surface consisting essentially of titanium nitride directly against the top and sidewall surfaces that consist essentially of tungsten.

2. The apparatus of claim 1 wherein the tungsten-containing lines are digit lines of a memory array.

3. The apparatus of claim 1 comprising silicon nitride directly against the protective material.

4. The apparatus of claim 1 comprising silicon dioxide directly against the protective material.

5. An apparatus comprising:
   a structure having a region which comprises tungsten, the region having a base surface facing a substrate and being in direct physical contact with and extending entirely across a width of a conductive structure, an upper surface opposing and elevationally above the base surface and two sidewall surfaces extending between the upper surface and the base surface, the sidewall surfaces consisting essentially of tungsten; and a protective material in direct contact with each of the two sidewall surfaces, the protective material consisting essentially of titanium nitride.

\* \* \* \* \*